(12) United States Patent
Fukami

(10) Patent No.: US 10,989,738 B2
(45) Date of Patent: Apr. 27, 2021

(54) INSPECTION APPARATUS AND INSPECTION METHOD

(71) Applicant: KABUSHIKI KAISHA NIHON MICRONICS, Tokyo (JP)

(72) Inventor: Yoshiyuki Fukami, Tokyo (JP)

(73) Assignee: KABUSHIKI KAISHA NIHON MICRONICS, Tokyo (JP)

(*) Notice: Subject to any disclaimer, the term of this patent is extended or adjusted under 35 U.S.C. 154(b) by 115 days.

(21) Appl. No.: 16/515,871

(22) Filed: Jul. 18, 2019

(65) Prior Publication Data
US 2020/0064374 A1 Feb. 27, 2020

(30) Foreign Application Priority Data
Aug. 27, 2018 (JP) .............................. JP2018-158243

(51) Int. Cl.
*G01R 1/07* (2006.01)
*G01R 1/073* (2006.01)
(Continued)

(52) U.S. Cl.
CPC ......... *G01R 1/073* (2013.01); *G01R 31/2808* (2013.01); *G01R 31/2812* (2013.01); *G01R 31/50* (2020.01)

(58) Field of Classification Search
CPC . G01R 31/50; G01R 31/2812; G01R 31/2808
See application file for complete search history.

(56) References Cited

U.S. PATENT DOCUMENTS

| 5,408,189 A | * | 4/1995 | Swart | ................ | G01R 1/07314 |
| | | | | | 324/750.22 |
| 6,031,384 A | * | 2/2000 | Furuta | ................ | G01R 31/2893 |
| | | | | | 324/757.04 |

(Continued)

FOREIGN PATENT DOCUMENTS

| JP | H_04270973 A | 9/1992 |
| KR | 10-2007-0114628 | 12/2007 |

(Continued)

OTHER PUBLICATIONS

First Office Action dated Jul. 30, 2020 in the corresponding Korean Patent Application No. 10-2009-0093856.

(Continued)

*Primary Examiner* — Alvaro E Fortich
(74) *Attorney, Agent, or Firm* — Bacon & Thomas, PLLC

(57) ABSTRACT

To reduce inspection time by changing an action speed of a movable axis movable part while considering size information of an electrode terminal as a contact destination of a probe. An inspection apparatus of the present disclosure is an inspection apparatus with a plurality of movable probes that brings each of the movable probes into contact with each of a plurality of objects to be inspected on a board to be inspected so as to measure electrical characteristics between the objects to be inspected. The inspection apparatus includes a plurality of movable parts that support the movable probes, move the movable probes in a plurality of axis directions, and position the movable probes at positions of the objects to be inspected so that the movable probes are in contact with the objects to be inspected, a drive unit that drives the movable parts moving the movable probes, and a drive control unit that controls an action speed of the movable parts moving the movable probes in accordance (Continued)

with size information of the objects to be inspected as next contact destinations of the movable probes.

6 Claims, 3 Drawing Sheets

(51) Int. Cl.
  *G01R 31/28* (2006.01)
  *G01R 31/50* (2020.01)

(56) References Cited

U.S. PATENT DOCUMENTS

| | | | |
|---|---|---|---|
| 10,261,124 B2* | 4/2019 | Dunklee | B23Q 1/00 |
| 2016/0232724 A1* | 8/2016 | Peev | G01D 3/08 |

FOREIGN PATENT DOCUMENTS

| | | |
|---|---|---|
| TW | 201350865 A | 12/2013 |
| TW | M536751 U | 2/2017 |
| TW | 201730567 A | 9/2017 |

OTHER PUBLICATIONS

First Office Action dated Apr. 29, 2020 in corresponding Taiwan Patent Appln. No. 108126707.

* cited by examiner

INSPECTION APPARATUS AND INSPECTION METHOD

CROSS-REFERENCE TO RELATED APPLICATIONS

The present application claims, under 35 USC 119, priority of Japanese Patent Application No. 2018-158243 filed on Aug. 27, 2018.

TECHNICAL FIELD

The present disclosure relates to an inspection apparatus and an inspection method, and may be applied to an inspection apparatus performing continuity inspection or insulation inspection of wirings formed on a printed board, for example.

BACKGROUND ART

For continuity inspection or insulation inspection of wirings on a printed board, there is used a mobile contact inspection apparatus using movable probes. The flying prober is an example of such a mobile contact inspection apparatus (see Patent Literature 1).

For example, a board to be inspected is placed on a work table of a flying prober, and each of a plurality of movable probes, which move in an X-axis direction, a Y-axis direction, and a Z-axis direction, is appropriately moved to be sequentially brought into contact with each measurement point (electrode terminal) on the board to be inspected for measurement of electrical characteristics. For this, various kinds of inspection data necessary for the inspection is generated on the basis of design data of a board to be inspected, for example. One of such inspection data is position information of measurement points (electrode terminals) on a board to be inspected. A movable axis drive unit drives movable axes (movable parts) positioning probes on the basis of position information of the measurement points.

CITATION LIST

Patent Literature

Patent Literature 1: Japanese Patent Application Laid-open No. H04-270973

SUMMARY

Technical Problem

However, in the conventional mobile contact inspection apparatus, the action speed of the movable axes moving movable probes is constant. Thus, the inspection time becomes longer as the number of measurement points on a board to be inspected is increased.

Meanwhile, if the action speed of the movable axes moving probes is increased, the accuracy of positioning probes is deteriorated. Especially if the probes are brought into contact with fine electrode terminals, the accuracy of positioning probes is deteriorated.

Thus, there have been demanded an inspection apparatus and an inspection method capable of changing an action speed of a movable axis drive unit while considering size information of electrode terminals that are contact destinations of probes, so as to reduce inspection time.

Solution to Problem

To solve such problems, a first aspect of the present disclosure is an inspection apparatus with a plurality of movable probes that brings each of the movable probes into contact with each of a plurality of objects to be inspected on a board to be inspected so as to measure electrical characteristics between the objects to be inspected, the inspection apparatus including (1) a plurality of movable parts that support the movable probes, move the movable probes in a plurality of axis directions, and position the movable probes at positions of the objects to be inspected so that the movable probes are in contact with the objects to be inspected, (2) a movable drive unit that drives the movable parts moving the movable probes, and (3) a drive control unit that controls an action speed of the movable parts moving the movable probes in accordance with size information of the objects to be inspected as next contact destinations of the movable probes.

A second aspect of the present disclosure is an inspection method, with a plurality of movable probes, of bringing each of a plurality of movable probes into contact with each of a plurality of objects to be inspected on a board to be inspected so as to measure electrical characteristics between the objects to be inspected, the inspection method including, (1) by each of the movable parts, supporting the movable probes, moving the movable probes in a plurality of axis directions, and positioning the movable probes at positions of the objects to be inspected so that the movable probes are in contact with the objects to be inspected, (2) by a movable driving unit, driving the movable parts moving the movable probes, and (3) by a drive control unit, controlling an action speed of the movable parts moving the movable probes in accordance with size information of the objects to be inspected as next contact destinations of the movable probes.

Advantageous Effects of Invention

In the present disclosure, it is possible to change an action speed of the movable axis drive unit while considering size information of electrode terminals that are contact destinations of the probes so as to reduce inspection time.

DESCRIPTION OF EMBODIMENTS

(A) Main Embodiment

The following will describe an embodiment of an inspection apparatus and an inspection method according to the present disclosure, with reference to the enclosed drawings.

The embodiment exemplifies a case in which the present disclosure is applied to a flying prober, as an example of the inspection apparatus (mobile contact inspection apparatus).

(A-1) Configuration of Embodiment

Figure 1:
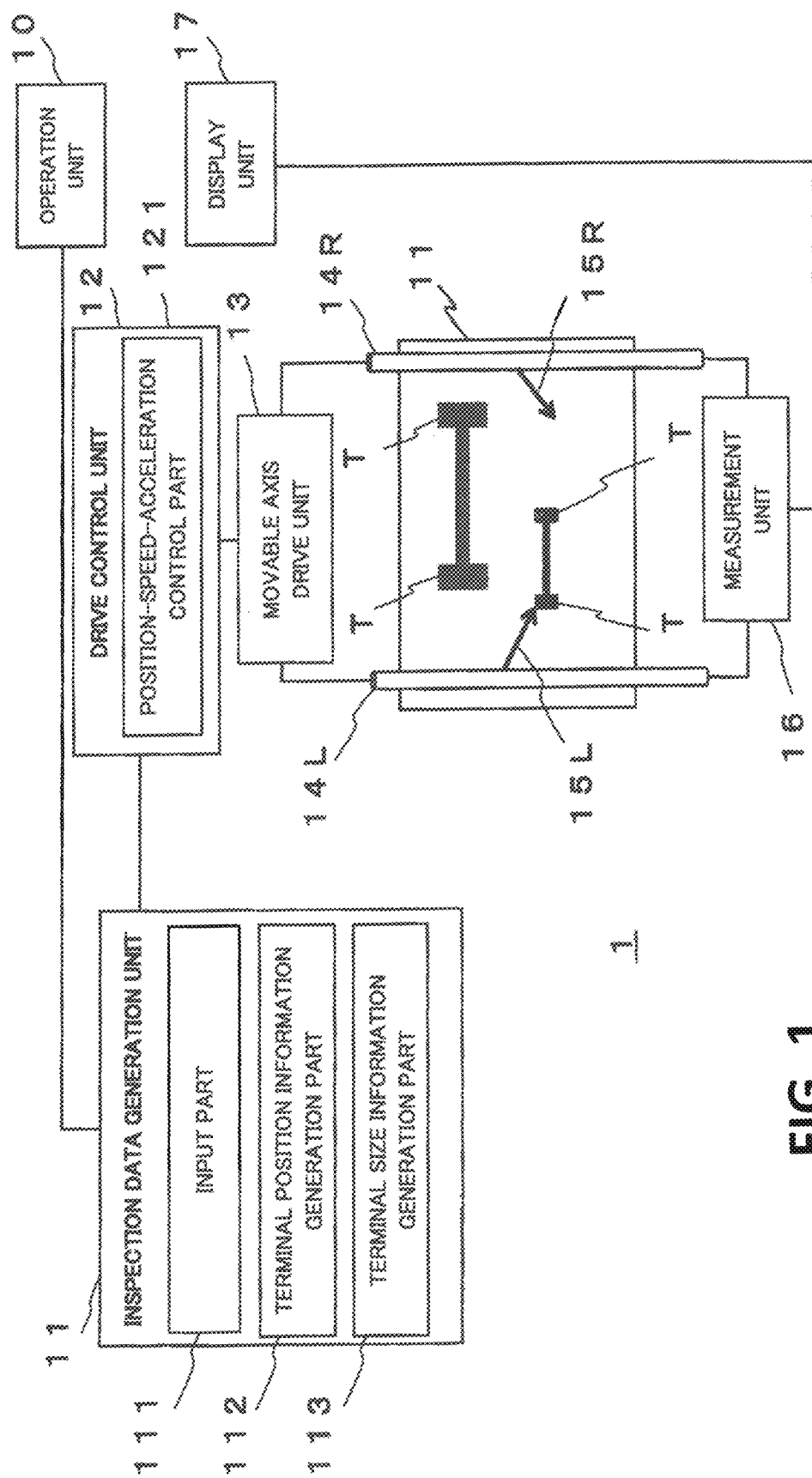
FIG. 1 is a block diagram illustrating a functional configuration of an inspection apparatus according to an embodiment.

FIG. 1 is a block diagram illustrating a functional configuration of an inspection apparatus according to the embodiment.

In FIG. 1, the inspection apparatus 1 of the embodiment includes an inspection data generation unit 11, a drive control unit 12, a movable axis drive unit 13, a left movable axis 14L, a left probe 15L, a right movable axis 14R, a right probe 15R, a measurement unit 16, a display unit 17, and an operation unit 10.

The operation unit 10 is a keyboard, a mouse, an operation button, and the like, for example, and is managed by an operator of the inspection apparatus 1. The display unit 17 displays measurement results measured by the measurement unit 16.

The inspection data generation unit 11 is a device that generates position information of measurement points (electrode terminals) on a board to be inspected, size information of the electrode terminals, and the like to the drive control unit 12. Note that although the hardware configuration of the inspection data generation unit 11 is not illustrated, a general computer, a dedicated device, or the like may be applied.

The inspection data generation unit 11 inputs design data of a board to be inspected, and generates, on the basis of the design data, inspection data necessary for continuity inspection and insulation inspection of the board to be inspected. The inspection data includes various kinds of data. For example, the inspection data includes the number of electrode terminals that are measurement points based on the design data of the board to be inspected, position information of electrode terminals (X-Y coordinate values), the shape of the electrode terminals, size information of electrode terminals, and the like. Then, the inspection data generation unit 11 supplies the generated inspection data to the drive control unit 12.

Note that the inspection data generation unit 11 functionally includes an input part 111, a terminal position information generation part 112, and a terminal size information generation part 113.

The input part 111 inputs design data of a board to be inspected. As the design data input method, various methods may be applied widely. For example, the design data may be input through the operation unit 10. Alternatively, a recording medium recording design data is inserted (connected) into the inspection data generation unit 11 to input the design data. In any cases, the design data of a board to be inspected by the inspection apparatus 1 is input to the inspection data generation unit 11.

The terminal position information generation part 112 generates position information (X-Y coordinate values) of electrode terminals as measurement points, on the basis of the input design data of the board to be inspected.

The terminal size information generation part 113 generates information of the shape and size of electrode terminals, on the basis of the input design data of the board to be inspected.

The drive control unit 12 controls the movable axis drive unit 13 on the basis of inspection data from the inspection data generation unit 11. The drive control unit 12 functionally includes a position-speed-acceleration control part 121.

The position-speed-acceleration control part 121 controls, on the basis of position information (X-Y coordinate values) of the electrode terminal T included in inspection data, the movable axis drive unit 13 driving the movable axes 14L and 14R supporting probes (left probe 15L and right probe 15R) so that the probes are brought into contact with a surface of the electrode terminal T. The order of the electrode terminals T (measurement points) sequentially made contact by the probes is predetermined. On the basis of the position information (X-Y coordinate values) of the electrode terminal T, the position-speed-acceleration control part 121 specifies a moved position of each probe to the movable axis drive unit 13, so that the probes (left probe 15L and right probe 15R) are moved in the X-direction and the Y-direction, and then in the Z-direction to be in contact with the electrode terminal T.

Moreover, the position-speed-acceleration control part 121 controls an action speed and an acceleration of the movable axis drive unit 13 on the basis of position information of the electrode terminal T and size information of the electrode terminal that are included in the inspection data. In this manner, although the action speed of the movable axis drive unit 13 is constant conventionally, the action speed of the movable axis drive unit 13 may be variable in the embodiment.

For example, if the size of the electrode terminal T to be made contact next by the movable probes is relatively large, the action speed and the acceleration of the movable axis drive unit 13 are increased (speed and acceleration are made faster). With this, the movable probes move to the position of the electrode terminal T as the next contact destination at a relatively high speed. Meanwhile, if the size of the electrode terminal T to be made contact next by the movable probe is relatively small, the action speed and the acceleration of the movable axis drive unit 13 are reduced (or at a speed almost equal to the conventional action speed and acceleration of the movable axis drive unit 13). With this, the movable probes move to the position of the electrode terminal T as the next contact destination at a relatively slow speed (or at a speed almost equal to the conventional speed). In this manner, the action speed and the acceleration of the movable axis drive unit 13 are made variable in accordance with the size of the electrode terminal T so as to maintain the accuracy of positioning movable probes. The size of the electrode terminal T is varied from around a few hundreds of μm to around 10 μm, for example. In a case where the movable probe is brought into contact with the large electrode terminal T, even if the moving speed of the movable probe is increased to some extent, it is possible to maintain the accuracy of positioning the probe because the size of the electrode terminal T as a contact object is large. However, on the other hand, in a case where the movable probe is brought into contact with a small electrode terminal T while keeping a high moving speed and acceleration of the movable probe, the accuracy of positioning the probe may be deteriorated because the size of the electrode terminal T as a contact object is small. Then, in the embodiment, the position-speed-acceleration control part 121 controls the action speed and the acceleration of the movable axis drive unit 13 in accordance with size information of the electrode terminal T to be made contact next by the movable probe. In this manner, although the movable axis drive unit 13 drives the movable axes 14L and 14R conventionally at a constant action speed, the action speed of the movable axis drive unit 13 may be variable in accordance with the size of the electrode terminal T as the next contact destination of the movable probe. As a result, it is possible to increase the inspection speed and reduce the inspection time while maintaining the accuracy of positioning movable probes.

The left movable axis 14L is an axis mechanism movable part that supports and positions the left probe 15L. The right movable axis 14R is an axis mechanism movable part that supports and positions the right probe 15R.

The left movable axis 14L and the right movable axis 14R are formed including an X-axis direction drive mechanism, a Y-axis direction drive mechanism, and a Z-axis direction drive mechanism. The left movable axis 14L and the right movable axis 14R receive drive power from the movable axis drive unit 13, and move the left probe 15L and the right probe 15R in the X-axis direction, the Y-axis direction, and the Z-axis direction.

The movable axis drive unit 13 drives the left movable axis 14L and the right movable axis 14R including the X-axis direction drive mechanism, the Y-axis direction drive mechanism, and the Z-axis direction drive mechanism. The movable axis drive unit 13 is formed including a servo motor, and the like, for example. The movable axis drive unit 13 is formed to separately drive the left movable axis 14L and the right movable axis 14R, and also separately drive the X-axis direction drive mechanism, the Y-axis direction drive mechanism, and the Z-axis direction drive mechanism of each of the left movable axis 14 and the right movable axis 14R. That is, the movable axis drive unit 13 is formed to independently drive the left movable axis 14L and the right movable axis 14R in the X-axis direction, the Y-axis direction, and the Z-axis direction.

The measurement unit 16 supplies inspection signals to the left probe 15L and the right probe 15R in contact with the electrode terminal T as a measurement point to measure electrical characteristics of wirings. The display unit 17 displays the measurement result by the measurement unit 16.

(A-2) Action of Embodiment

The following will describe in detail the method of controlling the movable axes in the inspection apparatus 1 of the embodiment, with reference to the enclosed drawings.

Figure 2:
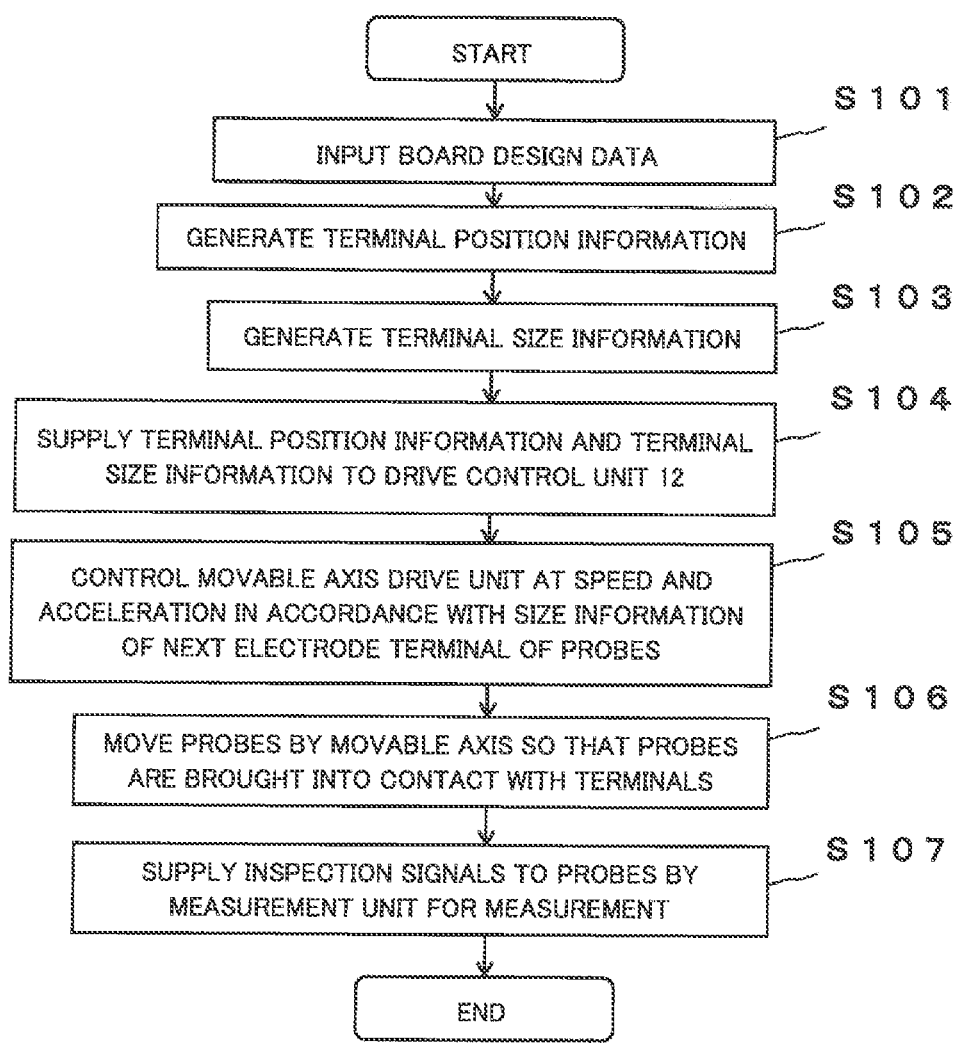
FIG. 2 is a flowchart illustrating a movable axis control processing in the inspection apparatus according to the embodiment.

FIG. 2 is a flowchart illustrating movable axis control processing in the inspection apparatus 1 of the embodiment.

First, once design data of a board to be inspected is input to the inspection data generation unit (S101), the inspection data generation unit 11 generates inspection data necessary for the inspection of the board to be inspected on the basis of the design data of the board to be inspected. In the embodiment, the terminal position information generation part 112 generates position information (X-Y coordinate values) of the electrode terminal T on the board to be inspected on the basis of the design data of the board to be inspected (S102), and the terminal size information generation part 113 generates size information of the electrode terminal T on the basis of the above-described design data (S103).

The inspection data including the position information (X-Y coordinate values) and the size information of the electrode terminal T, which is generated by the inspection data generation unit 11, is supplied to the drive control unit 12 (S104).

Then, in the drive control unit 12, the position-speed-acceleration control part 121 controls the action speed and the acceleration of the movable axes 14L and 14R on the basis of the position information and the size information of the electrode terminal T as the next contact destination of the movable probes (left probe 15L and right probe 15R) (S105). Note that the method of controlling the speed and the acceleration of the movable axes 14L and 14R by the position-speed-acceleration control part 121 is not particularly limited. For example, the position-speed-acceleration control part 121 may output a high current value to the movable axis drive unit 13 to increase the action speed and the acceleration of the movable axes 14L and 14R, while it may output a low current value to the movable axis drive unit 13 to reduce the action speed and the acceleration of the movable axes 14L and 14R. In this manner, it is also possible to set and output a current value in accordance with the action speed and the acceleration of the movable axis drive unit 13 to be controlled.

By the control of the position-speed-acceleration control part 121, the movable axis drive unit 13 drives the movable axes 14L and 14R to move the movable probes (left probe 15L and right probe 15R) in the X-direction and the Y-direction to a position of the electrode terminal T as the next contact destination of the probes (left probe 15L and right probe 15R) and, at the position of the electrode terminal T (X-Y coordinate values), moves the probes (left probe 15L and right probe 15R) in the Z-direction. In this manner, the probes (left probe 15L and right probe 15R) are brought into contact with the electrode terminal T (S106), and the measurement unit 16 outputs inspection signals to the probes (left probe 15L and right probe 15R) for measurement (S107).

Figure 3:
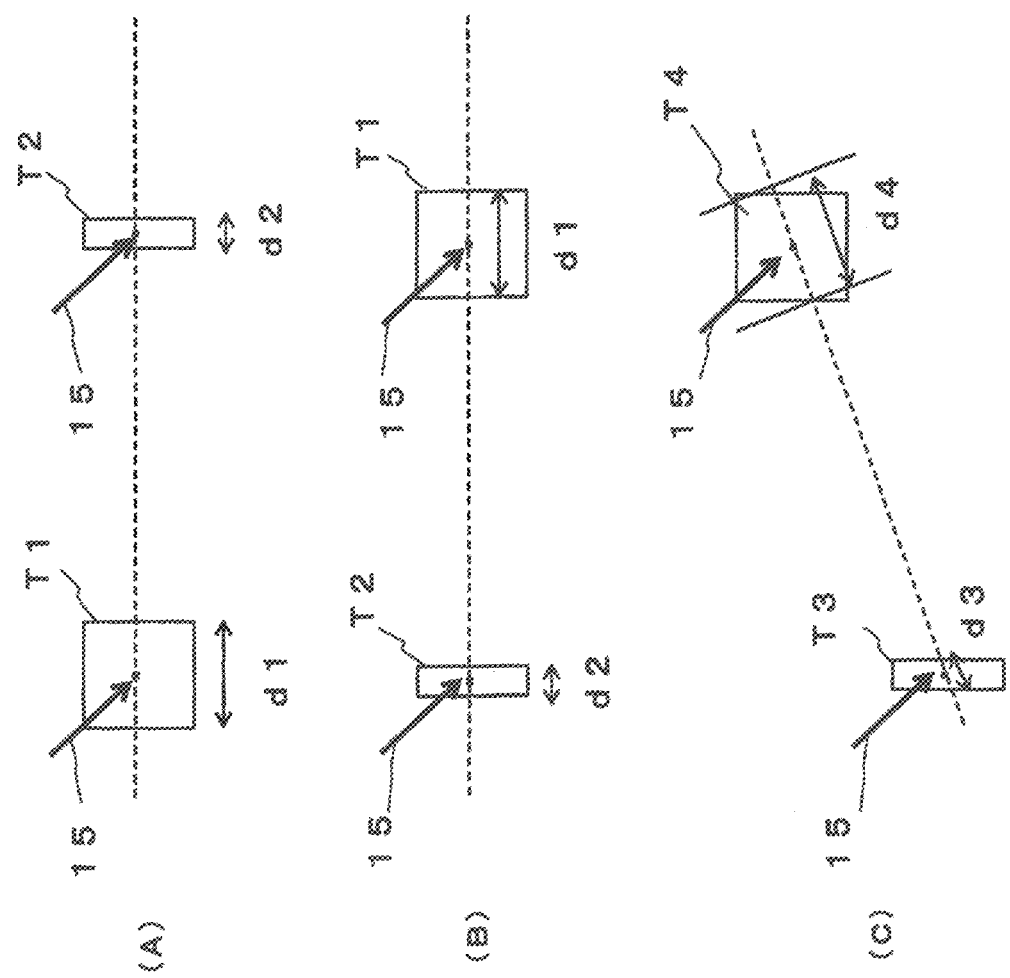
FIG. 3 is an explanatory diagram illustrating a control method of an action speed and an acceleration of movable axes according to the embodiment.

FIG. 3(A) to FIG. 3(C) are explanatory diagrams illustrating a method of controlling an action speed and an acceleration of the movable axes 14L and 14R according to the embodiment.

FIG. 3(A) exemplifies the case in which the movable probe 15, which is currently at a position of the electrode terminal T1 and in contact with the electrode terminal T1, is moved to a position of the next electrode terminal T2. The movable probe 15 is basically moved from a center of the electrode terminal T1 to a center of the electrode terminal T2. On a straight line passing two points of the center of the electrode terminal T1 and the center of the electrode terminal T2, the length of the electrode terminal T1 is d1 and the length of the electrode terminal T2 is d2 (d1>d2).

Here, the position-speed-acceleration control part 121 compares the length d1 of the current electrode terminal T1 of the movable probe 15 with the length d2 of the electrode terminal T2 as the next contact destination of the movable probe 15. Then, when the length d2 of the next electrode terminal T2 is smaller than the length d1 of the current electrode terminal T1, the position-speed-acceleration control part 121 makes a control to reduce the action speed and the acceleration of the movable axes 14L and 14R.

Meanwhile, as illustrated in FIG. 3(B), when the length d1 of the electrode terminal T1 as the next contact destination of the movable probe 15 is equal to or larger than the length d2 of the current electrode terminal T2, the position-speed-acceleration control part 121 makes a control to increase the action speed and the acceleration of the movable axes 14L and 14R.

Moreover, as illustrated in FIG. 3(C), even if there exists inclination in a straight line connecting the position (center position) of the electrode terminal T3 currently in contact with the movable probe 15 and the position (center position) of the next electrode terminal T4, a length d4 of the electrode terminal T4 on the straight line is possible.

This is because when the movable probe 15 moves along an inclined straight line (dotted line in FIG. 3(C)), the action speed and the acceleration of the movable axes 14L and 14R are determined while determining a range (length) allowing the probe 15 to be in contact with the electrode terminal T4 as the next contact destination. In other words, if the range (length) allowing the movable probe 15 to be in contact with the next electrode terminal T is large, the contact range of the probe 15 is large, and thus the action speed and the acceleration of the probe 15 are increased. Meanwhile, if the range (length) allowing the movable probe 15 to be in contact with the next electrode terminal T is small, the contact range of the probe 15 is small, which makes it difficult to position the probe. Thus, the action speed and the acceleration of the probe 15 are reduced. Note that it is possible to calculate the inclination of the straight line using the position information of the current electrode terminal and the position information of the next electrode terminal.

As illustrated in FIG. 3(A) and FIG. 3(B), the size of the next electrode terminal T of the movable probe may be determined using the size information of the electrode terminal T as it is. Alternatively, as illustrated in FIG. 3(C), the size of the next electrode terminal T of the movable probe may be determined using the position information of the electrode terminal T in addition to the size information of the electrode terminal T.

Furthermore, as the method of determining the action speed and the acceleration of the movable axes 14L and 14R, with a predetermined function expression for calculating an action speed and an acceleration in proportion to a length of the electrode terminal T as a next contact destination, the action speed and the acceleration of the movable axes 14L and 14R may be calculated using a length of the next electrode terminal T in accordance with the above-described function expression, for example.

As another method, regarding the length of the next electrode terminal T, the length of the electrode terminal T is divided using a plurality of thresholds, and a predetermined action speed and acceleration are determined in accordance with ranges divided by the thresholds. The method of determining the action speed and the acceleration of the movable axes 14L and 14R is not limited to the above-described examples, and various methods may be applied widely.

The description of the method of controlling the action speed and the acceleration of the movable axes 14L and 14R using FIG. 3(A) to FIG. 3(C) has exemplified the case in which the length of the current electrode terminal is compared with the length of the next electrode terminal. However, it is also possible to calculate the action speed and the acceleration of the movable axes 14L and 14R using the length of the next electrode terminal without comparing the length of the current electrode terminal with the length of the next electrode terminal.

(A-3) Effect of Embodiment

As described above, in the embodiment, it is possible, using at least the position information and the size information of electrode terminals, to change an action speed and an acceleration of the movable axis drive unit in accordance with the size information of the electrode terminal as the next contact destination of the movable probes. This consequently reduces inspection time for continuity inspection and insulation inspection of a board to be inspected.

(B) Other Embodiments

In the above-described embodiment, various modifications have been described as examples. In addition, the present disclosure may be also applied to the following modifications.

(B-1) In the above-described embodiment, the moving speed of the movable probe moving between electrode terminals is variable. Therefore, it is also possible to adjust the contact order of electrodes to be sequentially made contact by the movable probe (probe moving route) so as to consequently reduce inspection time.

(B-2) The above-described embodiment has exemplified the case in which the inspection apparatus includes two probes of the left probe and the right probe. However, the number of the probes is not particularly limited.

(B-3) Moreover, the above-described embodiment has exemplified the case in which the movable axes supporting and moving the probes are X-Y-Z three-axes movable. However, the number of movable axes is not limited thereto.

(B-4) Furthermore, the inspection apparatus may include a plurality of movable probes that may be brought into contact with electrode terminals existing on an upper surface (first surface) and a lower surface (second surface) of a board to be inspected.

REFERENCE SIGNS LIST

1 inspection apparatus
11 inspection data generation unit
12 drive control unit
13 movable axis drive unit
14L left movable axis
14R right movable axis
15L left probe
15R right probe
16 measurement unit
17 display unit
10 operation unit
111 input part
112 terminal position information generation part
113 terminal size information generation part
121 position-speed-acceleration control part
T (T1 to T4) electrode terminal

The invention claimed is:

1. An inspection apparatus with a plurality of movable probes that brings each of the movable probes into contact with each of a plurality of objects to be inspected on a board to be inspected so as to measure electrical characteristics between the objects to be inspected, the inspection apparatus comprising:
    a plurality of movable parts that support the movable probes, move the movable probes in a plurality of axis directions, and position the movable probes at positions of the objects to be inspected so that the movable probes are in contact with the objects to be inspected;
    a drive unit that drives the movable parts moving the movable probes; and
    a drive control unit that controls an action speed of the movable parts moving the movable probes in accordance with size information of the objects to be inspected as next contact destinations of the movable probes.

2. The inspection apparatus according to claim 1, wherein the drive control unit sets an action speed of the movable part of the movable probe to a first speed if the size information of the object to be inspected as the next contact destination of the movable probe is relatively large, and
    the drive control unit sets an action speed of the movable part of the movable probe to a second speed lower than the first speed if the size information of the object to be inspected as the next contact destination of the movable probe is relatively small.

3. The inspection apparatus according to claim 1, wherein the drive control unit changes an action speed of the movable part of the movable probe in accordance with a result of comparison between the size information of the object to be inspected in contact with the movable probe and the size information of the object to be inspected as the next contact destination.

4. The inspection apparatus according to claim 1, further including an inspection data generation unit that generates position information of the object to be inspected and the size information of the object to be inspected on the board to be inspected, wherein the drive control unit controls an action speed of the movable part moving the movable probe on a basis of the position information of the object to be inspected and the size information of the object to be inspected that are obtained from the inspection data generation unit.

5. The inspection apparatus according to claim 2, wherein the drive control unit changes an action speed of the movable part of the movable probe in accordance with a result of comparison between the size information of the object to be inspected in contact with the movable probe and the size information of the object to be inspected as the next contact destination.

6. An inspection method of bringing each of a plurality of movable probes into contact with each of a plurality of objects to be inspected on a board to be inspected so as to measure electrical characteristics between the objects to be inspected, the inspection method comprising:

by each of the movable parts, supporting the movable probes, moving the movable probes in a plurality of axis directions, and positioning the movable probes at positions of the objects to be inspected so that the movable probes are in contact with the objects to be inspected;

by a driving unit, driving the movable parts moving the movable probes; and by a drive control unit, controlling an action speed of the movable parts moving the movable probes in accordance with size information of the objects to be inspected as next contact destinations of the movable probes.

* * * * *